United States Patent
Tseng

(10) Patent No.: US 6,277,688 B1
(45) Date of Patent: Aug. 21, 2001

(54) METHOD OF MANUFACTURING A DRAM CAPACITOR WITH INCREASED ELECTRODE SURFACE AREA

(75) Inventor: Horng-Huei Tseng, Hsinchu (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 09/609,267

(22) Filed: Jun. 30, 2000

(51) Int. Cl.⁷ .............................. H01L 21/8242
(52) U.S. Cl. .................... 438/255; 438/253; 438/398; 438/396
(58) Field of Search .................... 438/255, 253, 438/256, 399, 398, 396

(56) References Cited

U.S. PATENT DOCUMENTS

| | | | |
|---|---|---|---|
| 5,150,276 | * 9/1992 | Gonzalez et al. | 438/253 |
| 5,821,139 | * 10/1998 | Tseng | 438/253 |
| 5,963,804 | * 10/1999 | Figura et al. | 438/255 |
| 6,146,961 | * 11/2000 | Graettinger et al. | 438/396 |
| 6,150,213 | * 11/2000 | Luo et al. | 438/253 |
| 6,204,142 | * 3/2001 | Thakur | 438/396 |

FOREIGN PATENT DOCUMENTS

2000114486-A * 4/2000 (JP).

* cited by examiner

Primary Examiner—Michael Trinh
(74) Attorney, Agent, or Firm—Darby & Darby

(57) ABSTRACT

A method of manufacturing a capacitor of a dynamic random access memory cell is disclosed. The method includes forming a capacitor opening through a dielectric isolation interlayer to expose a buried contact area. A conductive bottom plug is subsequently formed in a bottom portion of the capacitor opening and makes an electrical connection with the contact area. A conductive spacer is formed on the sidewall of the opening and then a dielectric spacer is formed on the sidewall of the conductive spacer. Such leaves a channel in the center of the capacitor opening. A conductive center column is therefore in the channel. Subsequently, the dielectric spacer is removed while leaving the conductive sidewall spacer, center column, and bottom plug to serve as a bottom storage node of the capacitor. Finally, a capacitor dielectric layer and a top storage node are formed to complete the capacitor fabrication.

21 Claims, 4 Drawing Sheets

US 6,277,688 B1

METHOD OF MANUFACTURING A DRAM CAPACITOR WITH INCREASED ELECTRODE SURFACE AREA

BACKGROUND OF THE INVENTION

1. Field of the Invention

This invention relates to semiconductor technology, and more particularly, to cell capacitors for use in dynamic random access memories (DRAMs).

2. Description of the Related Arts

The circuit density on integrated circuits has continually increased over the years due to innovations in process technologies. One particular device with increased density is the dynamic random access memory (DRAM), which is expected to have more than a billion memory cells (gigabits) by the year 2000. This higher density of memory cells is a result of improved high resolution photolithography and patterning by directional (anisotropic) plasma etching, which result in reduced device sizes. However, this reduction in device size is putting additional demand on the semiconductor processing technologies, and also on maintaining the electrical requirements, such as maintaining or increasing the capacitance of capacitors on DRAM devices.

These DRAM devices consist in part of an array of individual DRAM storage cells that store binary data (bits) as electrical charge on a storage capacitor. Further, the information is stored and retrieved from the storage capacitor by means of a single pass transistor in each memory cell, and by address and read/write circuits on the periphery of the DRAM chip. The pass transistor is usually a field effect transistor (FET), and the single capacitor in each cell is either formed in the semiconductor substrate as a trench capacitor, or built over the FET in the cell area as a stacked capacitor. To maintain a reasonable DRAM chip size and improved circuit performance, it is necessary to further reduce the area occupied by the individual cells on the DRAM chip. Unfortunately, as the cell size decreases, it becomes increasing more difficult to fabricate stacked or trench storage capacitors with sufficient capacitance to store the necessary charge to provide an acceptable signal-to-noise level for the read circuits (sense amplifiers) to detect. Accordingly, this is a continuing challenge to maintain sufficiently high storage capacitance despite decreasing cell area.

The principle way of increasing cell capacitance is through cell structure techniques. Such techniques include three-dimensional cell capacitors, such as trenched or stacked capacitors. This invention concerns methods of forming three-dimensional cell capacitors.

SUMMARY OF THE INVENTION

It is an object of the invention to provide a method of forming a three-dimensional cell capacitor having greater capacitance per unit area.

Another object of the invention is to provide a method of forming a capacitor integrated with self-aligned contact having increased electrode surface area.

In one embodiment, a capacitor opening is formed through a dielectric isolation interlayer to expose a buried contact area. A bottom plug of conductive material is subsequently formed in a bottom portion of the capacitor opening and makes an electrical connection with the contact area. A conductive spacer is formed on the sidewall of the opening by depositing a conformal layer and anisotropically etching back. Then a dielectric spacer is formed on the sidewall of the conductive spacer in the same manner, such that a channel is retained in the center of the capacitor opening. A conductive center column is therefore formed by filling the channel with conductive material. Subsequently, the dielectric spacer is removed while leaving the conductive sidewall spacer, conductive center column, and conductive bottom plug to serve as a bottom storage node of the capacitor. Finally, a capacitor dielectric layer is formed along the surface of the bottom storage node, and a top storage node is formed over the dielectric layer to complete the fabrication of the DRAM cell capacitor.

Other objects, features, and advantages of the present invention will become apparent from the following detailed description which makes reference to the accompanying drawings.

DETAILED DESCRIPTION OF THE INVENTION

Figure 1:
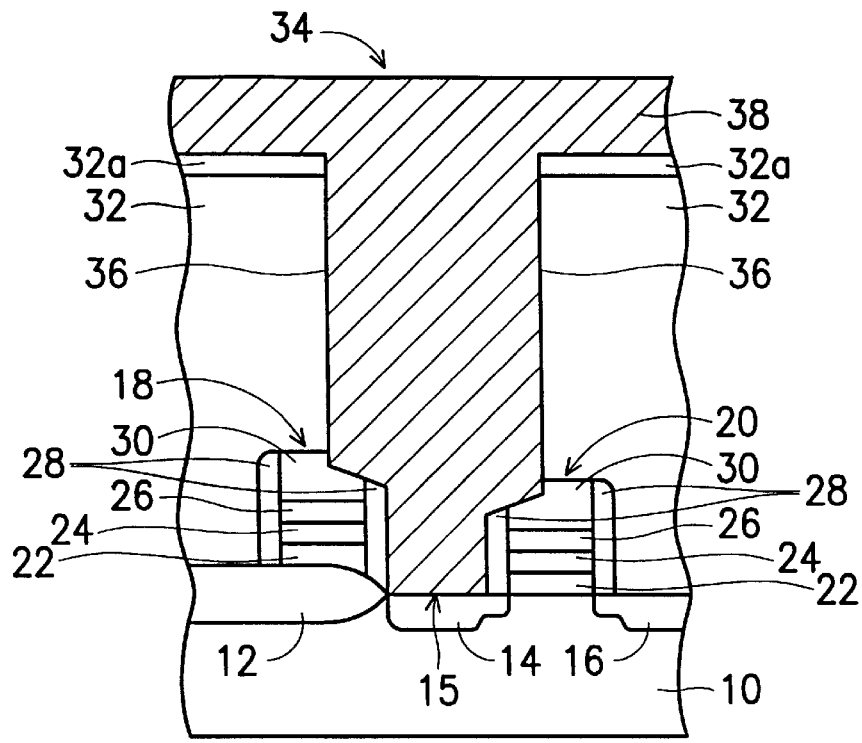
FIGS. 1–7 show cross-sectional views illustrative of various stages in the fabrication of a DRAM capacitor in accordance with a first embodiment of the present invention.

The present invention will be described in detail with reference to the accompanying drawings. Referring to FIG. 1, the method of the present invention begins by providing a semiconductor substrate 10. In the context of this document, the term "semiconductor substrate" is meant to include devices formed within a semiconductor wafer and the layers overlying the wafer. The term "substrate surface" is meant to include the upper most exposed layers on a semiconductor wafer, such as silicon surface and an insulating layer. The illustrated substrate includes an isolation region defined by isolation oxide 12 which is formed adjacent a substrate active area which includes diffusion regions 14, 16, received therein. A pair of conductive lines 18, 20, are formed over substrate 10 and constitute part of the preferred DRAM circuitry. Conductive lines 18, 20 are of standard construction and include an oxide layer 22, a polysilicon layer 24, and a silicide layer 26. Conductive lines 18, 20 also include respective sidewall spacers 28 and respective protective caps 30.

A first dielectric layer 32 is formed over substrate 10 and conductive lines 18, 20 as inter-layer dielectric (ILD) and is preferably planarized. Layer 32 preferably comprises an oxide material, such as borophosphosilicate glass (BPSG). More preferably, dielectric layer 32 comprises a top layer of etch barrier material 32a such as silicon nitride or silicon oxynitride, which serves as an etch stop (as described below in conjunction with FIG. 6).

An capacitor contact opening 34 is etched through layer 32 exposing the buried contact area 15. Such opening can be formed by a self-aligned contact etch with cap layers 30 and sidewall spacers 28 serving as etch stops, thus allowing self-alignment. A conventional plasma etch process such as reactive ion etching (RIE) can be used to create self-aligned contact opening 34. During subsequent processing steps, the storage node capacitor plate of the embodiment is fabricated to contact buried contact area 15.

Figure 2:
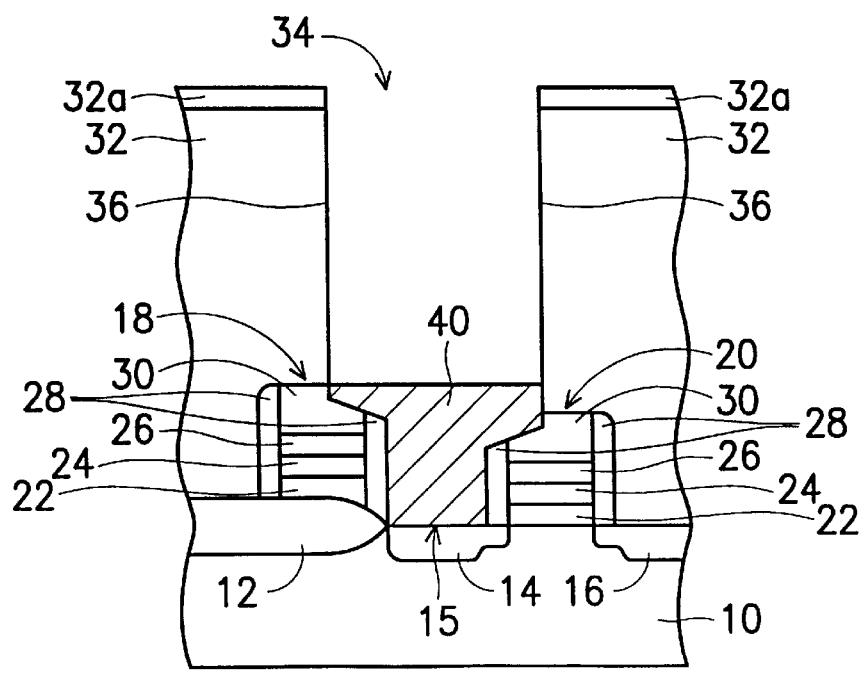

Next, a first layer of electrically conductive material 38 is formed over substrate 10 and completely filling capacitor opening 34. A preferred conductive material is in-situ doped polysilicon. Referring to FIG. 2, conductive layer 38 is anisotropically blanket etched back to leave behind only material disposed in a bottom portion of capacitor opening 34. Accordingly, a conductive bottom plug 40 is formed and makes an electrical connection with contact area 15. Conductive plug 40 preferably has an upper planar surface. The removal of conductive layer 38 can be accomplished by a plasma etch process such as reactive ion etch (RIE), and preferably exposes most of substantially vertical sidewall 36 of capacitor opening 34 as shown.

Figure 3:
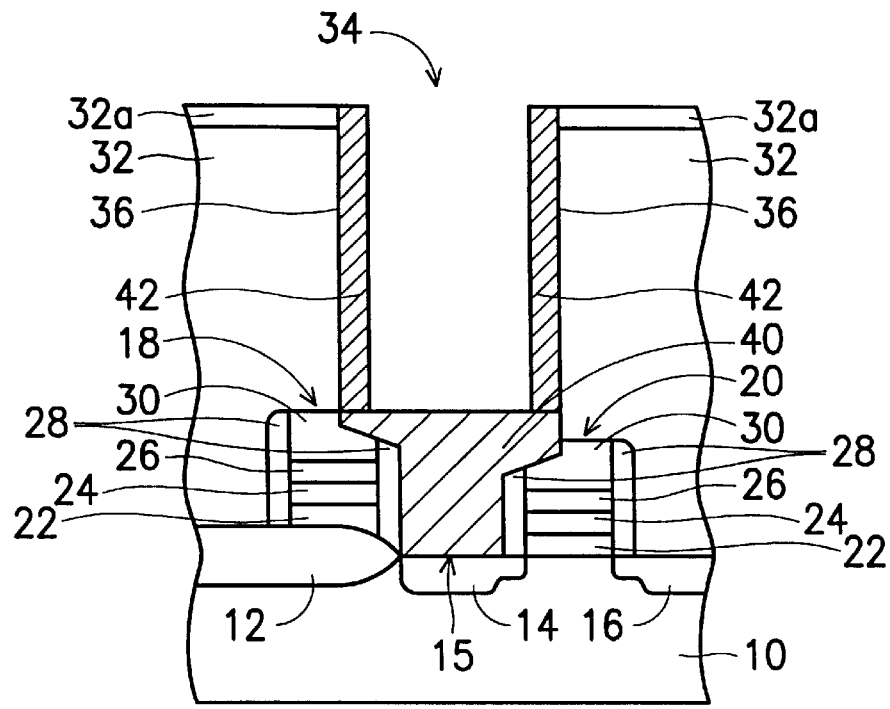

Referring to FIG. 3, a conductive sidewall spacer 42 is formed on sidewall 36 of capacitor opening 34. For example, a second conductive layer 42 is conformally deposited over dielectric layer 32 and along sidewall 36 of capacitor opening 34. Conductive layer 42 is then anisotropically etched back by a reactive ion etching (RIE) process to expose the top surface of first dielectric layer 32. As a result, the residual portions of conductive layer form a sidewall spacer 42 on sidewall 36 of capacitor opening 34. A preferred conductive material for conductive spacer 42 is in-situ doped polysilicon.

Figure 4:
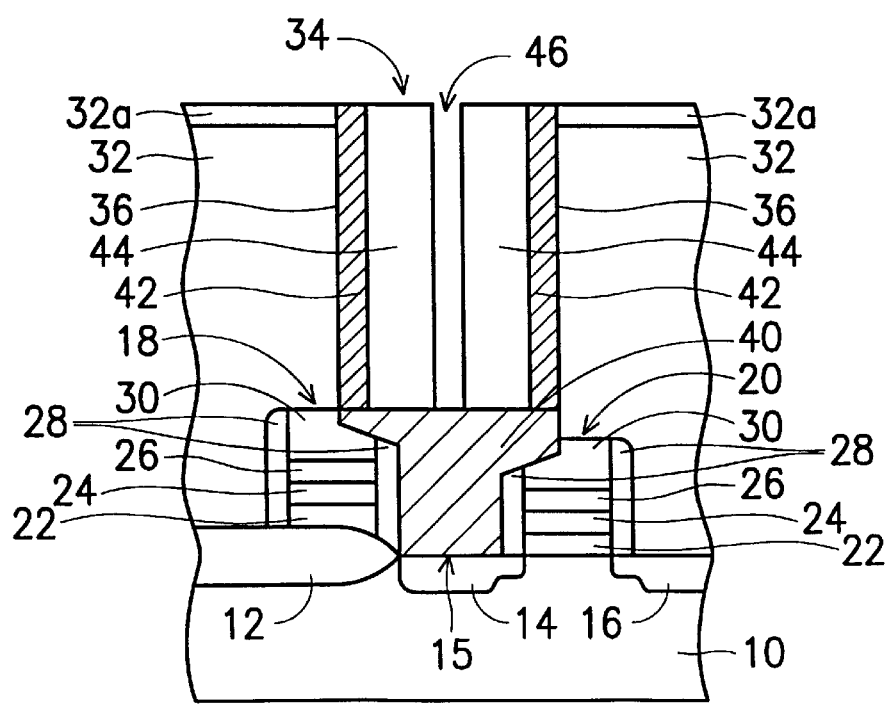

Referring to FIG. 4, a dielectric sidewall spacer 44 is formed on a sidewall of conductive spacer 42. Likewise, dielectric spacer 44 can be formed by depositing a second dielectric layer 44 conformally over first dielectric layer 32 and along a sidewall of conductive spacer 42 and anisotropically etching back. It should be noted that dielectric spacer 44 is formed to such a thickness as not to completely fill capacitor opening 34, and such leaves a channel 46 within the center of capacitor opening 34 as shown. A preferred material for dielectric spacer 44 is silicon oxide. Of course, other suitable dielectric materials can be used.

Figure 5:
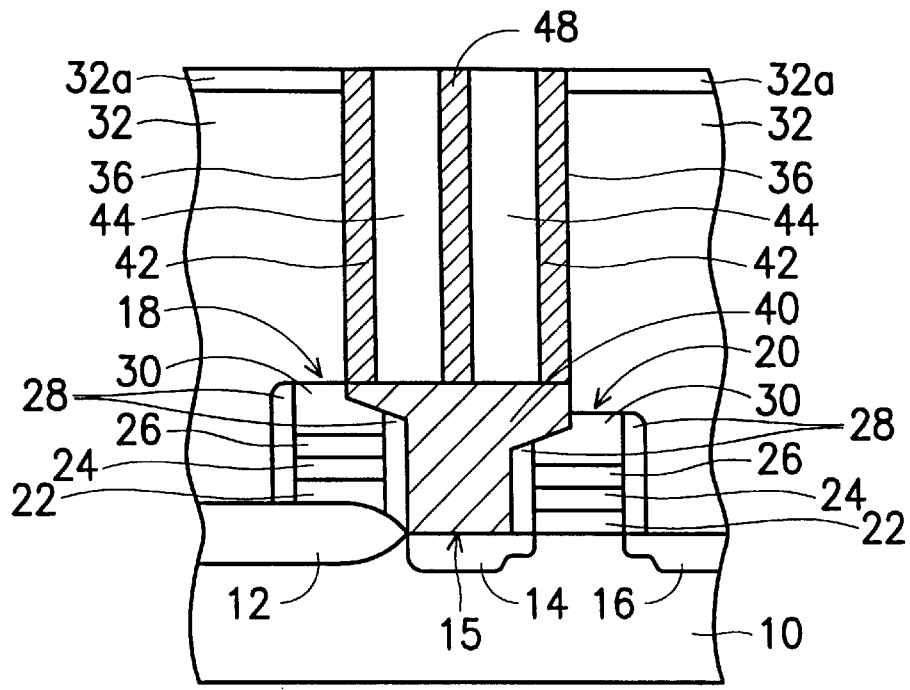

Referring to FIG. 5, a third conductive layer 48 is deposited over the substrate and completely fills center channel 44. Subsequently, portions of third conductive layer 48 are removed to leave behind only material which was deposited within channel 44. Accordingly, the residual portions of third conductive layer are left in the form of a conductive column 48 within the center of capacitor opening 34. The removal of such material can be accomplished by conventional techniques such as abrasion of the substrate by chemical mechanical polishing (CMP) or through a dry etch back process. Other techniques can, of course, be used. A preferred material for conductive column is in-situ doped polysilicon.

Figure 6:
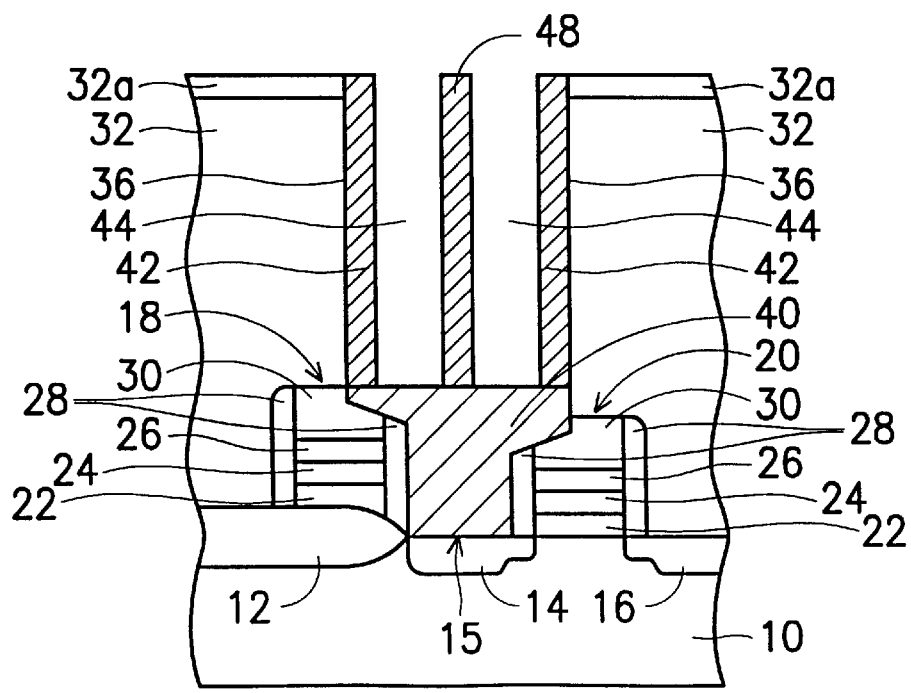

Referring to FIG. 6, dielectric spacer 44 is removed to reveal conductive column 50 and conductive spacer 42 which were formed within capacitor opening 34. As shown in FIG. 6, conductive column 50 is substantially centered in opening 34, spaced from sidewall spacer 42, and supported by bottom plug 40. Column 48 can have circular or non-circular cross sections. In a preferred embodiment, dielectric spacer 44 is removed selectively relative to column 48, spacer 42, and plug 40 by either a wet or dry etch thereof. For example, where dielectric spacer 44 is formed of silicon oxide and column 48, spacer 42, and plug 40 are formed of polysilicon, a HF vapor is preferably used to selectively remove the silicon oxide. During the process, barrier layer 32a (e.g., a silicon nitride or silicon oxynitride layer) acts as an etch stop to prevent etching of first dielectric layer 32. After this etching process, the resulting conductive structure, including center column 48, sidewall spacer 42, and bottom plug 40, serves as a bottom storage node for the DRAM cell capacitor.

Figure 7:
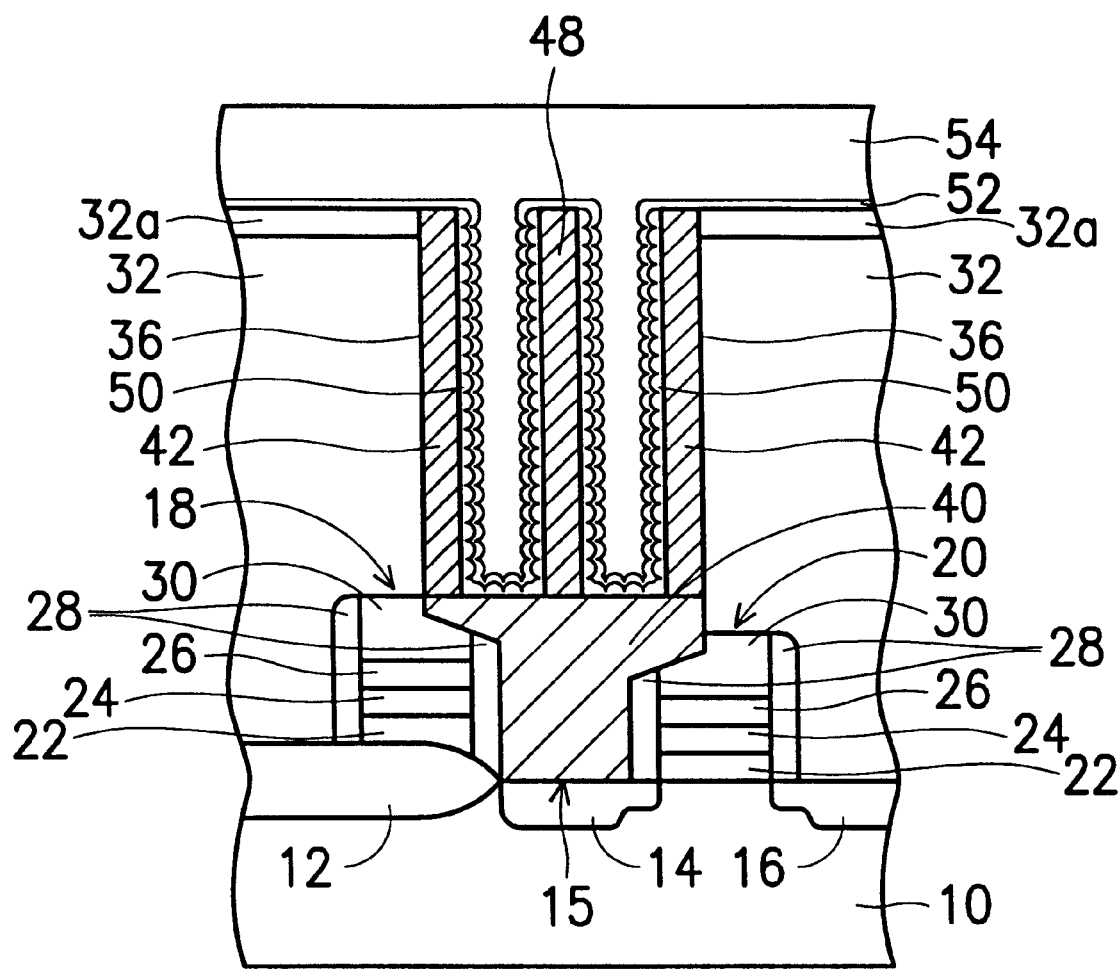

Referring to FIG. 7, in order to further increase the electrode area, a hemispherical grain (HSG) polysilicon 50 can be formed over the bottom storage node surface thereby increasing the capacitance. The hemispherical grain (HSG) polysilicon is preferably formed over the substrate and deposited within opening 34. Subsequently, such material is planarized as by suitable mechanical abrasion of the substrate to remove such material from outwardly of capacitor opening 34. Such material can also be removed through a dry etch back process. Preferably, during such removal, capacitor contact opening 34 is filled with photoresist to prevent removed particles from falling into the opening during planarization or to prevent etching of the material inside opening 34 during the dry etch back process. The photoresist is subsequently removed.

Thereafter, a capacitor dielectric layer 52 is then deposited along the surface of bottom storage node. Dielectric layer 52 is preferably formed of either a double film of nitride/oxide, a triple film of oxide/nitride/oxide, or any other high dielectric film such as $Ta_2O_5$. Subsequently, a fourth conductive layer 54 is formed over dielectric layer 52 to provide a top storage electrode. Typically, such top storage electrode 54 is formed of doped polysilicon or in-situ doped polysilicon. Thus, the resulting structure forms a three-dimensional capacitor that provides an enlarged electrode surface area. This increased electrode surface area of the capacitor increases the capacitance of the capacitor. Therefore the present invention increases the performance of the capacitor, thereby allowing a smaller sized capacitor to be used in the DRAM cell.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A method for forming a capacitor on a semiconductor substrate, said method comprising the steps of:

forming a dielectric isolation interlayer above said semiconductor substrate;

forming an opening in said interlayer to expose a contact area of said substrate;

forming a conductive plug in a bottom portion of said opening to make an electrical connection with said contact area;

forming a conductive spacer on a sidewall of said opening;

forming a dielectric spacer on a sidewall of said conductive spacer, said dielectric spacer defining a channel in said opening;

forming an conductive column in said channel by filling said channel with conductive material;

selectively removing said dielectric spacer, while leaving said conductive spacer, said conductive column, and said conductive plug to serve as a bottom storage node of said capacitor;

forming a capacitor dielectric layer over said bottom storage node; and forming a conductive layer over said capacitor dielectric layer to serve as a top storage node of said capacitor.

2. The method as claimed in claim 1, wherein said dielectric isolation interlayer comprises borophosphosilicate glass (BPSG).

3. The method as claimed in claim 1, wherein said dielectric isolation interlayer comprises a top layer of etch barrier material.

4. The method as claimed in claim 3, wherein said dielectric isolation interlayer comprises a top layer of silicon nitride or silicon oxynitride.

5. The method as claimed in claim 1, wherein said opening is etched in a self-aligned manner to said contact area.

6. The method as claimed in claim 1, wherein said conductive plug, conductive spacer, and conductive column are formed of in-situ doped polysilicon.

7. The method as claimed in claim 1, wherein said dielectric spacer is formed of silicon oxide.

8. The method as claimed in claim 7, wherein said dielectric spacer is removed by using a HF vapor.

9. The method as claimed in claim 1, wherein said conductive column is substantially centered in said opening.

10. The method as claimed in claim 1, further comprising forming a hemispherical grain (HSG) polysilicon over the bottom storage node.

11. A method for forming a capacitor on a semiconductor substrate, said method comprising the steps of:

forming a first dielectric layer above said semiconductor substrate;

forming an opening in said first dielectric layer to expose a contact area of said substrate;

forming a first conductive layer on said first dielectric layer and completely filling said opening;

etching said first conductive layer to form a conductive plug in a bottom portion of said opening to make an electrical connection with said contact area;

forming a second conductive layer over said first dielectric layer and along a sidewall of said opening;

anisotropically etching said second conductive layer to form a conductive spacer on said sidewall of said opening;

forming a second dielectric layer over said first dielectric layer and along a sidewall of said conductive spacer;

anisotropically etching said second dielectric layer to form a dielectric spacer on said sidewall of said conductive spacer, said dielectric spacer defining a channel in said opening;

forming an conductive column in said channel by filling said channel with a third conductive layer;

removing said dielectric spacer while leaving said conductive spacer, said conductive column, and said conductive plug to serve as a bottom storage node of said capacitor;

forming a capacitor dielectric layer over said bottom storage node; and forming a fourth conductive layer over said capacitor dielectric layer to serve as a top storage node of said capacitor.

12. The method as claimed in claim 11, wherein said first dielectric layer comprises borophosphosilicate glass (BPSG).

13. The method as claimed in claim 11, wherein said first dielectric layer comprises a top layer of etch barrier material.

14. The method as claimed in claim 13, wherein said first dielectric layer comprises a top layer of silicon nitride or silicon oxynitride.

15. The method as claimed in claim 11, wherein said opening is etched in a self-aligned manner to said contact area.

16. The method as claimed in claim 11, wherein said first conductive layer is etched by using a reactive ion etching process.

17. The method as claimed in claim 11, wherein said conductive plug, conductive spacer, and conductive column are formed of in-situ doped polysilicon.

18. The method as claimed in claim 11, wherein said dielectric spacer is formed of silicon oxide.

19. The method as claimed in claim 18, wherein said dielectric spacer is removed by using a HF vapor.

20. The method as claimed in claim 11, wherein said conductive column is substantially centered in said opening.

21. The method as claimed in claim 11, further comprising forming a hemispherical grain (HSG) polysilicon over the bottom storage node.

* * * * *